(12) United States Patent
Chen et al.

(10) Patent No.: US 7,444,452 B2
(45) Date of Patent: Oct. 28, 2008

(54) COMPUTER SYSTEM WITH A PCI EXPRESS INTERFACE

(75) Inventors: Yu-Guang Chen, Taipei (TW);
Ying-Chun Tseng, Taipei (TW)

(73) Assignee: Asrock Incorporation, Taipei Hsien (TW)

( * ) Notice: Subject to any disclaimer, the term of this patent is extended or adjusted under 35 U.S.C. 154(b) by 298 days.

(21) Appl. No.: 11/101,405

(22) Filed: Apr. 8, 2005

(65) Prior Publication Data
US 2005/0228932 A1    Oct. 13, 2005

(30) Foreign Application Priority Data
Apr. 9, 2004    (TW) .............................. 93109931 A (51) Int. Cl.
*G06F 13/00* (2006.01)

(52) U.S. Cl. .................... 710/307; 710/104; 710/313

(58) Field of Classification Search ................. 710/104, 710/301, 313, 307
See application file for complete search history.

(56) References Cited

U.S. PATENT DOCUMENTS

| | | | |
|---|---|---|---|
| 7,136,953 B1 * | 11/2006 | Bisson et al. ............... 710/307 |
| 2005/0088445 A1 * | 4/2005 | Gonzalez et al. ........... 345/502 |
| 2005/0215085 A1 * | 9/2005 | Mehta et al. ................. 439/65 |
| 2005/0277337 A1 * | 12/2005 | Chen et al. ................. 439/637 |
| 2006/0023633 A1 * | 2/2006 | Caruk et al. ................ 370/252 |
| 2007/0094437 A1 * | 4/2007 | Jabori et al. ................ 710/307 |

OTHER PUBLICATIONS

PCI Express Base Specification Revision 1.0a; PCI-SIG; pp. 1-8,30,31,165, and 166; Apr. 15, 2003.*

* cited by examiner

*Primary Examiner*—Glenn A Auve
(74) *Attorney, Agent, or Firm*—Birch, Stewart, Kolasch & Birch, LLP (57) ABSTRACT

A computer system comprises a chip set having a PCI Express controller with a preset lane width, a PCI Express connector with a relative bigger lane width, and a PCI Express interfaced apparatus with the bigger lane width. In the system, only part of the contacts within the PCI Express connector is connected to the PCI Express controller while the other contacts are opened.

14 Claims, 9 Drawing Sheets

| Contact no. | A side | B side |
|---|---|---|
| 1 | +12V | PRSNT1# |
| 2 | +12V | +12V |
| 3 | RSVD | +12V |
| 4 | GND | GND |
| 5 | SMCLK | JTAG2 |
| 6 | SMDAT | JTAG3 |
| 7 | GND | JTAG4 |
| 8 | +3.3V | JTAG5 |
| 9 | JTAG1 | +3.3V |
| 10 | 3.3Vaux | +3.3V |
| 11 | WAKE# | PWRGD |
| Mechanical key | | |
| 12 | RSVD | GND |
| 13 | GND | REFCLK+ |
| 14 | HSOp(0) | REFCLK- |
| 15 | HSOn(0) | GND |
| 16 | GND | HSIp(0) |
| 17 | PRSNT2# | HSIn(0) |
| 18 | GND | GND |

Fig.10 (Prior Art)

| Contact no. | A side | B side |
|---|---|---|
| 1 | +12V | PRSNT1# |
| 2 | +12V | +12V |
| 3 | RSVD | +12V |
| 4 | GND | GND |
| 5 | SMCLK | JTAG2 |
| 6 | SMDAT | JTAG3 |
| 7 | GND | JTAG4 |
| 8 | +3.3V | JTAG5 |
| 9 | JTAG1 | +3.3V |
| 10 | 3.3Vaux | +3.3V |
| 11 | WAKE# | PWRGD |
| Mechanical key | | |
| 12 | RSVD | GND |
| 13 | GND | REFCLK+ |
| 14 | HSOp(0) | REFCLK- |
| 15 | HSOn(0) | GND |
| 16 | GND | HSIp(0) |
| 17 | PRSNT2# | HSIn(0) |
| 18 | GND | GND |
| 19 | HSOp(1) | RSVD |
| 20 | HSOn(1) | GND |
| 21 | GND | HSIp(1) |
| 22 | GND | HSIn(1) |
| 23 | HSOp(2) | GND |
| 24 | HSOn(2) | GND |
| 25 | GND | HSIp(2) |
| 26 | GND | HSIn(2) |
| 27 | HSOp(3) | GND |
| 28 | HSOn(3) | GND |
| 29 | GND | HSIp(3) |
| 30 | RSVD | HSIn(3) |
| 31 | PRSNT#2 | GND |
| 32 | GND | RSVD |

Fig. 11 (Prior Art)

COMPUTER SYSTEM WITH A PCI EXPRESS INTERFACE

BACKGROUND OF THE INVENTION (1) Field of the Invention

This invention relates to a computer system with a Peripheral component interconnect (PCI) Express interface, and more particularly to a computer system that adapts a high speed PCI Express interfaced apparatus to match a relative low speed PCI Express connector.

(2) Description of Related Art

A computer system typically includes a main board with a system bus formed thereon as a basic component. Various devices such as a central processing unit (CPU), a chip set, and memories adapted on the main board are communicated with each other. The chip set who plays a role of ruling signal and data transmission on the system bus and periphery buses is usually determined with the choice of the CPU. In addition, there should be various connectors associated with such periphery buses for connecting periphery components such as a displaying card, a hard disk, a floppy disk, a CDROM, etc.

Figure 1:
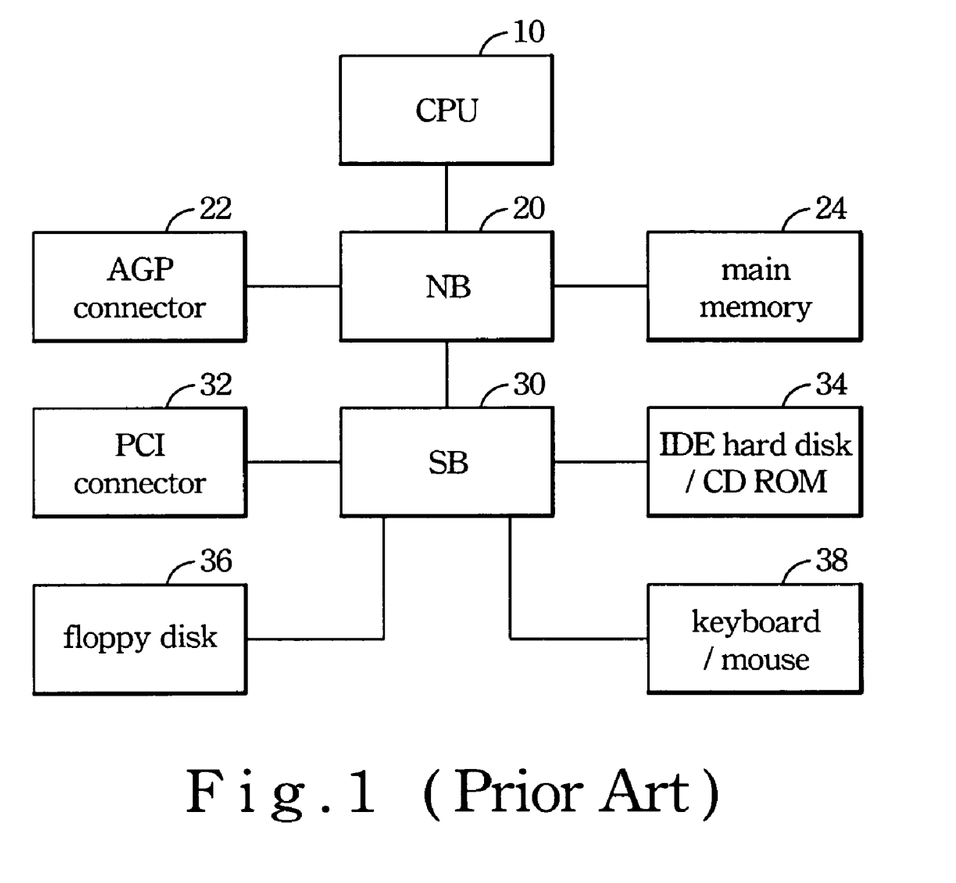
FIG. 1 depicts a schematic view of a typical main board with a chip set thereon.

Referring to FIG. 1, there is a prior art main board with a separated Southbridge (SB) 30 and a Northbridge (NB) 20. The NB 20 deals with data and signal transmission between a CPU 10, a main memory 24, and an accelerated graphics port (AGP) connectors 22. The NB 20 also communicates with the SB 30 by using a particular transmission protocol. The SB 30 has a PCI controller, an integrated devices electronics (IDE) controller, a universal serial bus (USB) controller, and other specific controllers for controlling various periphery components such as a PCI connector 32, a CDROM/hard disk 34, a floppy disk 36, and a keyboard/mouse 38, so as to deal with the input/output (I/O) signals from the periphery components 32,34,36,38. Furthermore, the SB 30 also transmits interrupt requests from the periphery components 32,34,36,38 to the NB 20 for asking the CPU 10 to set up a proper operation schedule dealing with the periphery components 32,34,36, 38.

An AGP interface, which is developed according to the need of a huge data stream resulted in a texture mapping technique of a 3D image, is provided to overcome the limitation of transmission speed of the traditional PCI interfaced displaying card. However, other advance PCI interfaced periphery components, such as an SCSI hard disk with an ultra 320 standard or an Ethernet adapter with a supporting transmission speed up to 10 GB, can provide a transmission speed surpassing that of PCI interface and thus cannot be compatible with the traditional AGP interface anymore. As a result, a new generation of the I/O port interface, the so-called PCI Express interface, is raised.

Figure 2:
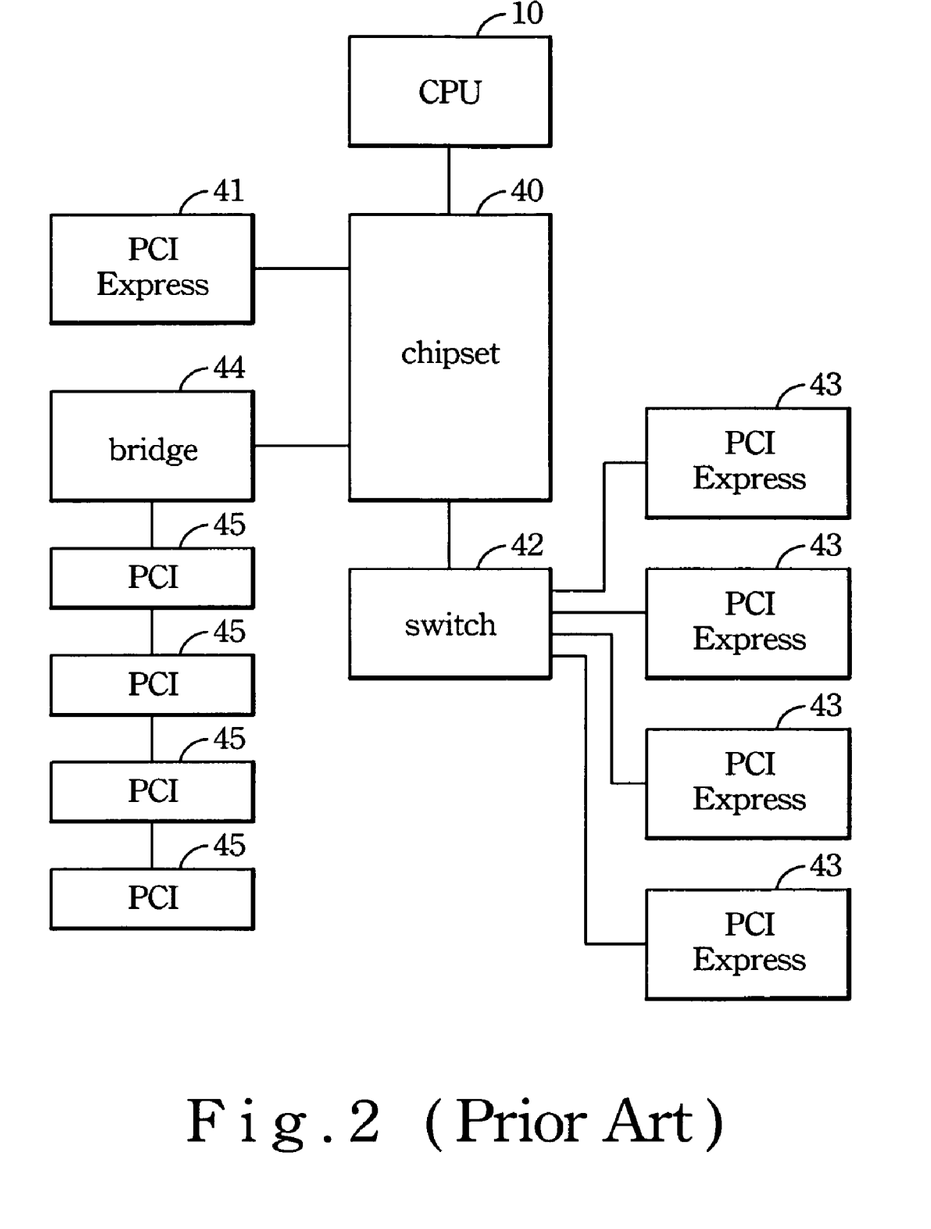
FIG. 2 depicts a schematic view of a PCI Express interface computer system.

The PCI Express interface standard, which is developed to replace the traditional PCI interface, is provided with high transmission speed and strong extension ability. For a better understanding, a typical computer system with the PCI Express interface is shown in FIG. 2. The chip set 40 of the computer system is able to connect to a PCI Express connector 41 with or without a switch 42, and connect to a PCI connector through a bridge 44. Upon such an arrangement, the developed PCI Express interface is able to support the traditional PCI interfaced apparatus and has a potential to replace the tradition PCI interface, or even the AGP interface.

The PCI Express interface features a serial-connection, point-to-point, and low-voltage-differential-signal (LVDS) (by using two transmission lines to create a voltage differential to represent logic signals 0 and 1) transmission, and has an increased transmission speed but with a reduced noise level. Under the technique standard of PCI Express interface, a basic PCI Express link specifies two pairs of LVDSs, one for transmitting signals and the other for receiving signals. Such a link is also represented as a "lane" with a standardized bit rate of about 2.5 Gbps.

As mentioned, it is known that either the bandwidth or the transmission speed of the PCI Express interface is decided by the amount of "lanes", and the increase in the "lanes" implies an increase of contacts within the PCI Express connector. Moreover, the PCI Express connector may have a selectable lane width of ×1, ×2, ×4, ×8, ×12, ×16, or ×32 with respect to a bit rate ranged from 2.5 Gbps to 80 Gbps.

Figure 3:
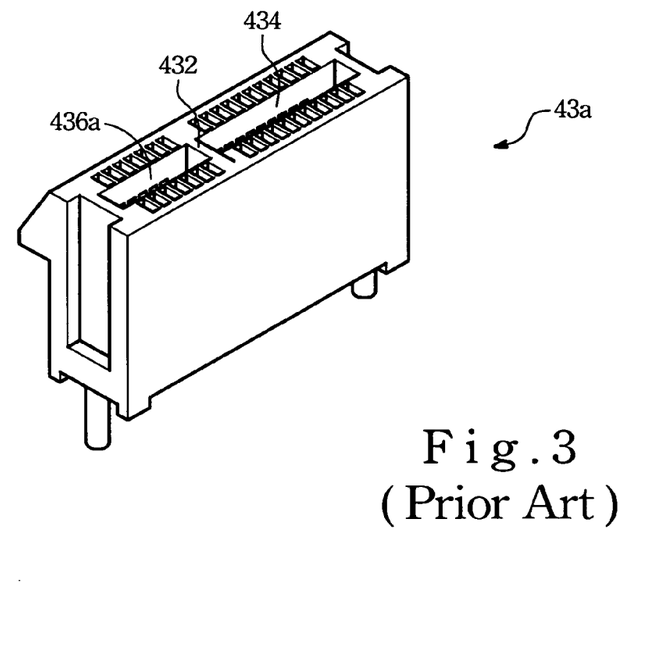
FIG. 3 depicts a schematic view of a typical ×1 PCI Express connector.
Figure 4:
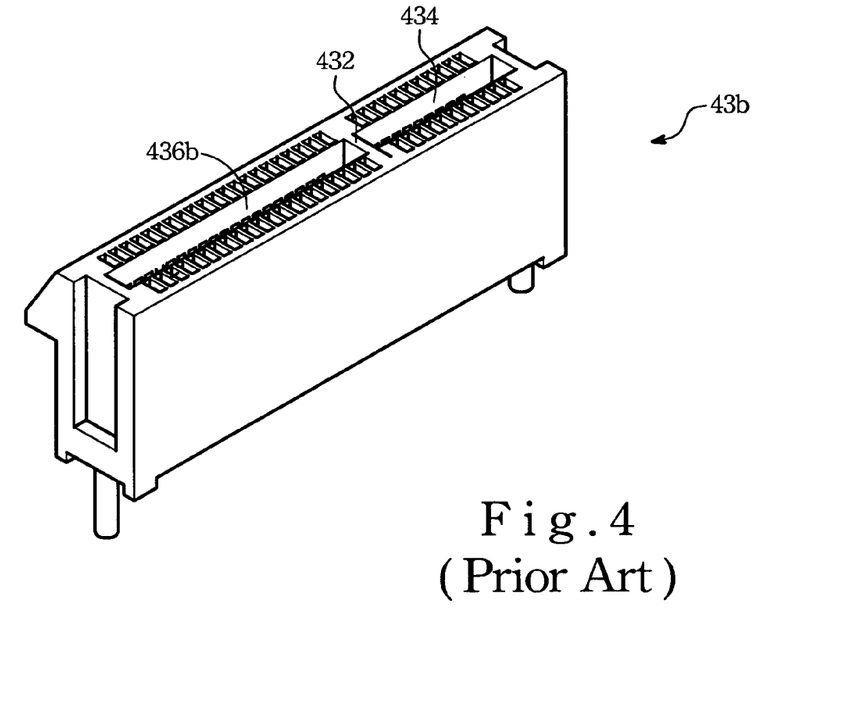
FIG. 4 depicts a schematic view of a typical ×4 PCI Express connector.
Figure 10:
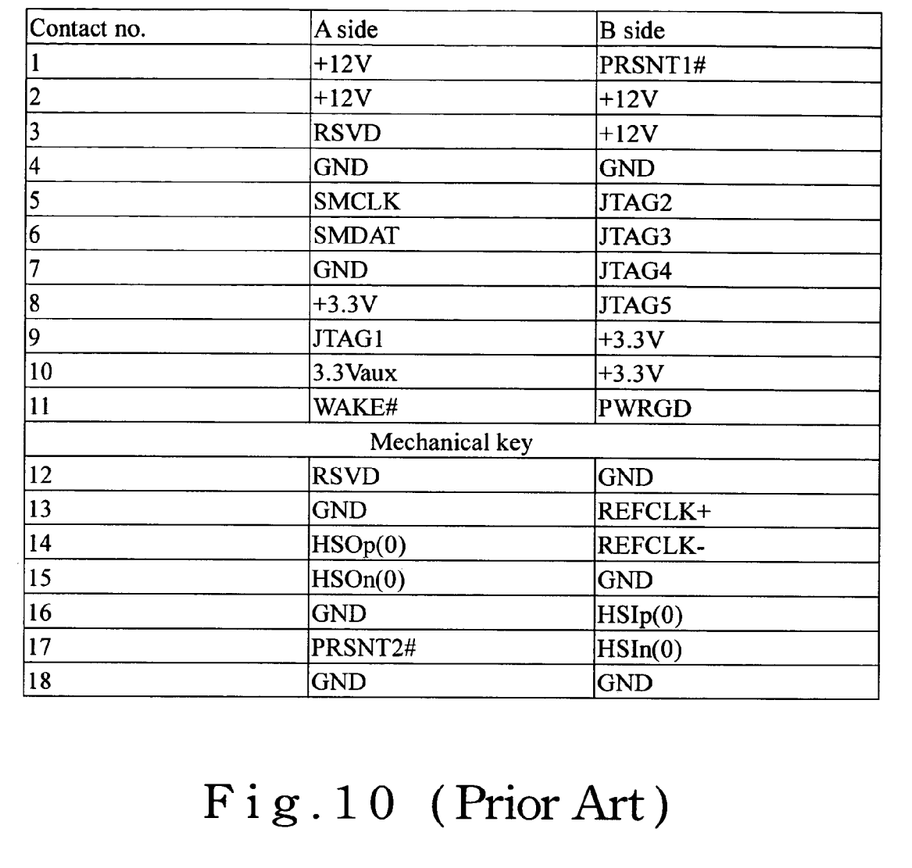
FIG. 10 shows a definition table of contacts in a ×1 PCI Express connector AGP.
Figure 11:
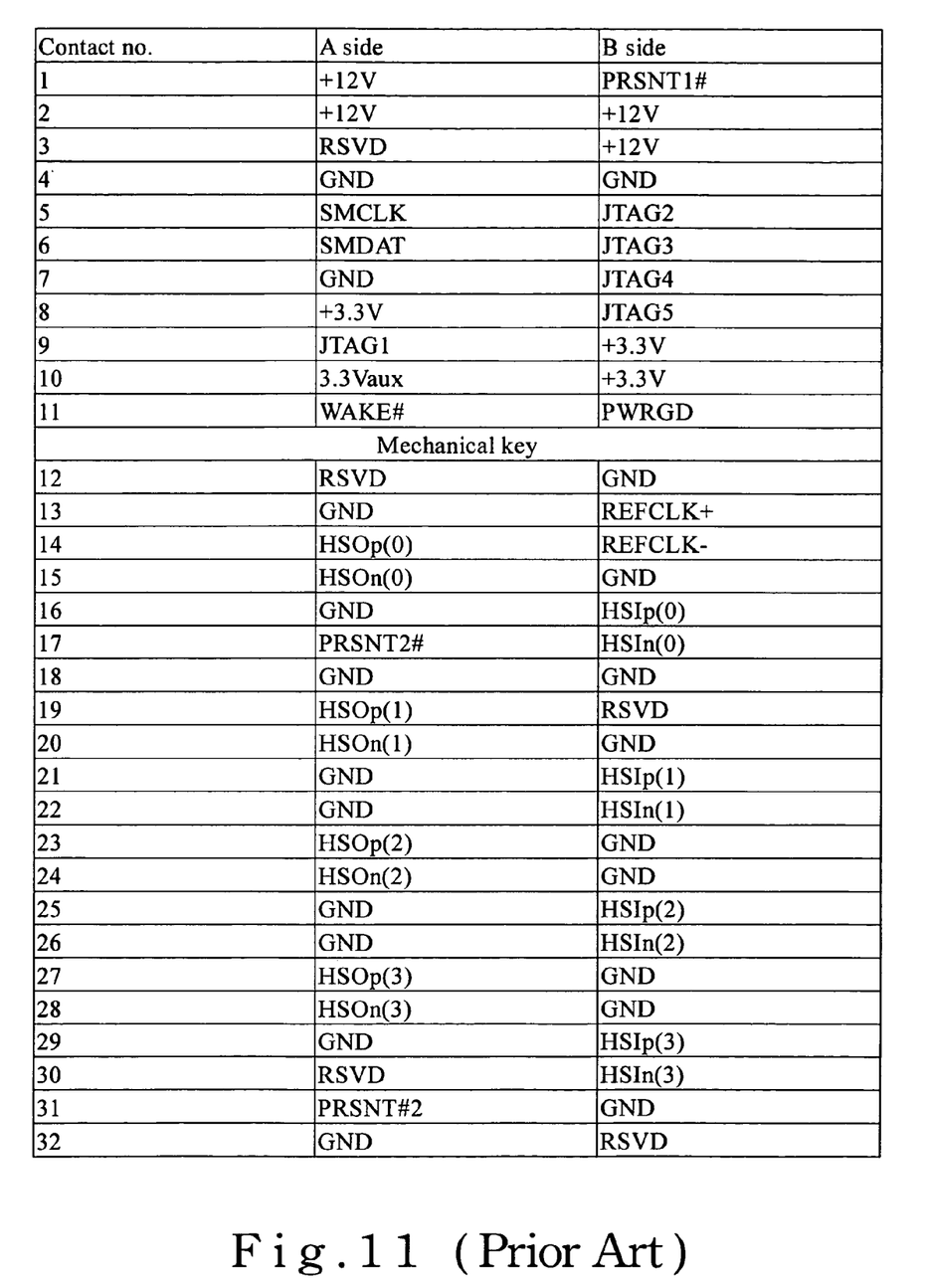
FIG. 11 shows a definition table of contacts in a ×4 PCI Express connector AGP.

FIG. 3 shows a typical ×1 PCI Express connector 43a, and FIG. 10 shows a corresponding contact definition table. FIG. 4 shows a typical ×4 PCI Express connector 43b, and FIG. 11 shows a corresponding contact definition table. In the contact definition tables of FIGS. 10 and 11, label "RSVD" represents the preserved contacts, label "GND" represents the grounding contacts, labels "JTAG1" to "JTAG5" represent testing contacts, label "3.3Vaux" represents a contact for applying a 3.3V auxiliary power, labels "SMCLK" and "SMDAT" represent respectively system management bus clock and data which control the data transmission between the connector and the controller, labels "REFCLK+" and "REFCLK−" represent contacts for delivering reference clock signals for generating differential pairs, labels "HSOp(i)" and "HSOn(i)" represent contacts for transmitting differential pairs, labels "HSIp(i)" and "HSIn(i)" represent contacts for receiving differential pairs, and labels "PRSNT#1" and "PRSNT#2" represent contacts for detecting the presence of a hot plug.

As mentioned, the ×4 PCI Express connector 43b has more "lanes" to represent a bigger lane width by comparing to the ×1 PCI Express connector 43a, and the ×4 PCI Express connector 43b has a longer slot to allocate an increased number of contacts. For a better understanding, it is shown in FIGS. 10 and 11 that the ×1 PCI Express connector 43a has only one "lane", whereas the ×4 PCI Express connector 43b has four "lanes". Furthermore, except for including the same contacts as that of the ×1 PCI Express connector 43a (the contacts #1~#18), the ×4 PCI Express connector 43b has additional fourteen contacts (the contacts #19~#32) for providing more "lanes". The added contacts (the contacts #19~#32) are aligned from a rear end of the original ×1 PCI Express connector 43a, i.e. from the contact #18 of FIG. 11.

As described above, the PCI Express connector with more lanes has a longer slot to allocate the increased number of contacts. Thus, the PCI Express interfaced apparatus having more lanes should have a broader area to locate golden fingers. When a conventional PCI Express connector with a preset lane width can be used to accept a PCI Express interfaced apparatus having a lane width less than that preset lane width, it is no way for such a PCI Express connector to accept another PCI Express interfaced apparatus having a lane width larger than that preset lane width.

Basically, the lane width of a PCI Express connector provided on the main board is identical to the lane width of the PCI Express controller within the chip set, and only the PCI Express interfaced apparatus with a smaller lane width with respect to the connector can be used.

In addition, almost all the PCI Express displaying cards in the market are provided with a ×16 lane width, and the respective ×16 PCI Express controller to the PCI Express displaying card is always provided in the NB. Restricted by the size and the number of contacts, the NB supporting PCI Express interface, such as the Grantsdale of Intel, cannot support the AGP interface. Therefore, in a current system, a PCI Express displaying card and an AGP displaying card cannot be used at the same time.

Accordingly, how to enable a PCI Express interface to adopt a PCI Express interfaced apparatus with a bigger lane width under any circumstance of the chip set now becomes an important topic.

SUMMARY OF THE INVENTION

A main object of the present invention is to adopt a PCI Express controller having a preset lane width with a PCI Express interfaced apparatus having a relative bigger lane width by introducing a PCI Express connector having the bigger lane width to connect with the PCI Express controller.

According to the present invention, an electronic system can comprise a PCI Express controller with a preset lane width, a PCI Express connector with a bigger lane width respective to that of the PCI Express controller, and a PCI Express interfaced apparatus with the bigger lane width. The PCI Express connector has a plurality of contacts, and parts of the contacts are electrically connected to the PCI Express controller. The PCI Express interfaced apparatus, which is plugged into the PCI Express connector, is electrically connected to the PCI Express controller through the electrically connected contacts.

A method of transferring a PCI Express connector with the preset lane width for accepting a PCI Express interfaced apparatus with a bigger lane width can comprises the steps of: providing a circuit board with a PCI Express bus; assembling a PCI Express controller with the preset lane width to a first end of the bus; and assembling a PCI Express connector with a bigger lane width to a second end of the bus, in which part of the contacts respective to the preset lane width are connected to the bus.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which.

DETAIL DESCRIPTION OF THE PREFERRED EMBODIMENTS

Figure 5:
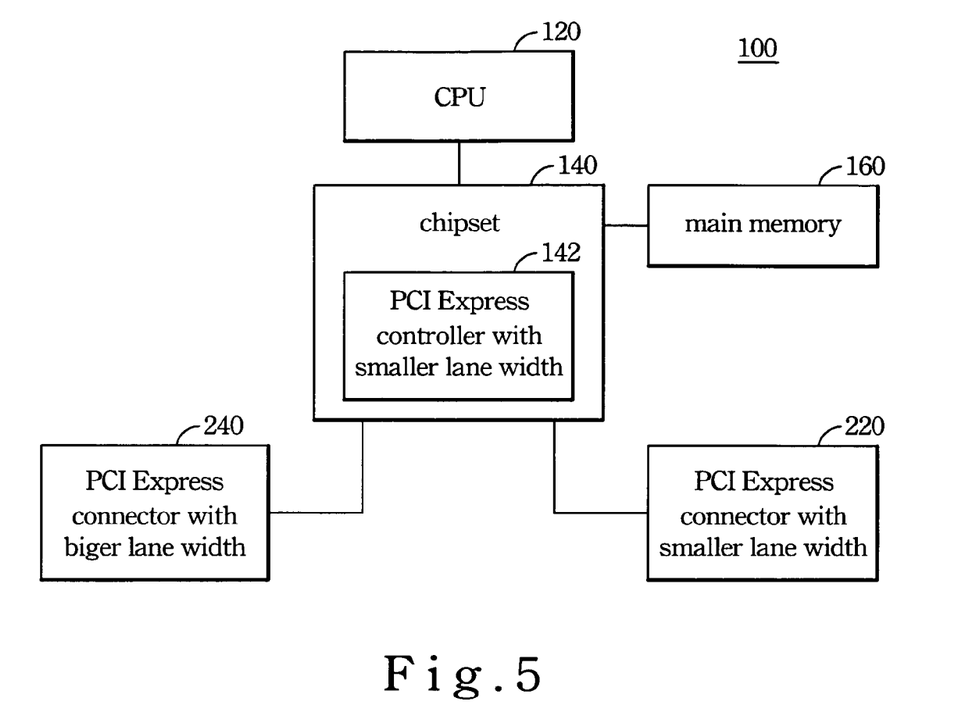
FIG. 5 depicts a schematic view of a preferred embodiment of the main board in accordance with the present invention.

FIG. 5 shows a preferred embodiment of a main board in accordance with the present invention. The main board 100 comprises a central processing unit (CPU) 120, a chip set 140, a main memory 160, a PCI Express connector 220 with a smaller lane width, and a PCI Express connector 240 with a bigger lane width. The chip set 140 having a PCI Express controller 142 for supporting a plurality of PCI Express bus transmission is connected to the PCI Express connector 220 and 240. The PCI Express controller 142 may be provided in a Northbridge (NB), a Southbridge (SB), or an isolated chip.

Referring back to FIGS. 3 and 4, as mentioned above, the ×4 PCI Express connector 43b has more "lanes" to present a bigger lane width with respect to the ×1 PCI Express connector 43a, and the ×4 PCI Express connector 43b has a longer slot with respect to the ×1 PCI Express connector 43a for providing an increased number of contacts. It is also understood that, as shown in FIGS. 10 and 11, except for the identical contacts (#1~#18) in both the ×1 and the ×4 PCI Express connectors 43a and 43b, the ×4 PCI Express connector 43b has additional fourteen contacts (#19~#32) for providing more "lanes". The extra contacts (#19~#32) are arranged to begin from the contact #18 of FIG. 11.

It is noted that, both in the ×1 PCI Express connector 43a and the ×4 PCI Express connector 43b, a mechanical key 432 is provided to divided the slot of the connector into a front portion 434 and a rear portion 436a or 436b to prevent from miss-plugging. Moreover, the contacts (#1~#11) regarding to the control signals are provided in the front portion 434, and the contacts (#12~) regarding to the transmission speed as well as the lane width are provided in the rear portion 436a or 436b.

If the PCI Express connector 220 in FIG. 5 is a ×1 PCI Express connector 43a, the PCI Express controller 142 is a ×1 PCI Express controller such as the SB 965 series of SiS, while the PCI Express connector 240 is a ×4 PCI Express connector. Each contact within the ×1 PCI Express connector 220 other than the ground one is electrically connected to the ×1 PCI Express controller 142 according to the contact definition of FIG. 10. However, in the ×4 PCI Express connector 240, which has fourteen additional contacts with respect to the ×1 PCI Express connector 220, only the contacts respect to the ×1 PCI Express connector 220 are connected to the ×1 PCI Express controller 142.

In order to prevent the fourteen additional contacts within the PCI Express connector 240 from retarding a normal operation of the PCI Express interface, there are two connecting tragedies. Firstly, the contacts #19~#32 of the ×4 PCI Express connector 240 are totally opened. Secondly, among the contacts #19~#32 of the ×4 PCI Express connector 240, the contacts labeled "GND" of FIG. 11 such as #21, 22, 25, 26, 29, and 32 of the A side, and #27, 28, and 31 of the B side are grounded, and the rest are opened.

Figure 6A:
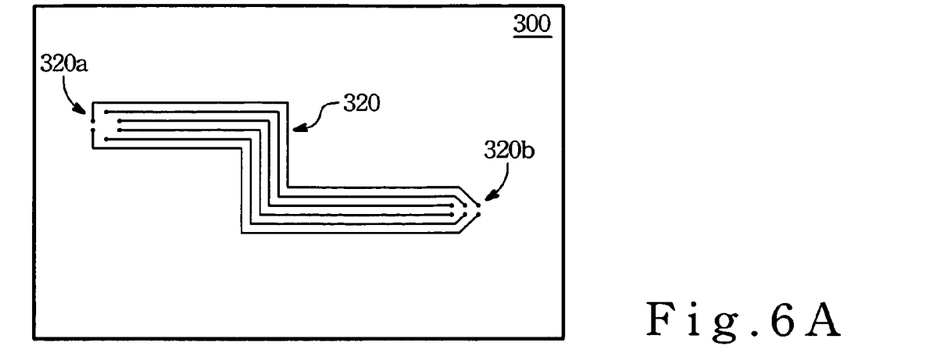
FIG. 6A to 6C depict schematic views of a method for adopting a PCI Express connector with a bigger lane width to a PCI Express controller with a smaller lane width.
Figure 6B:
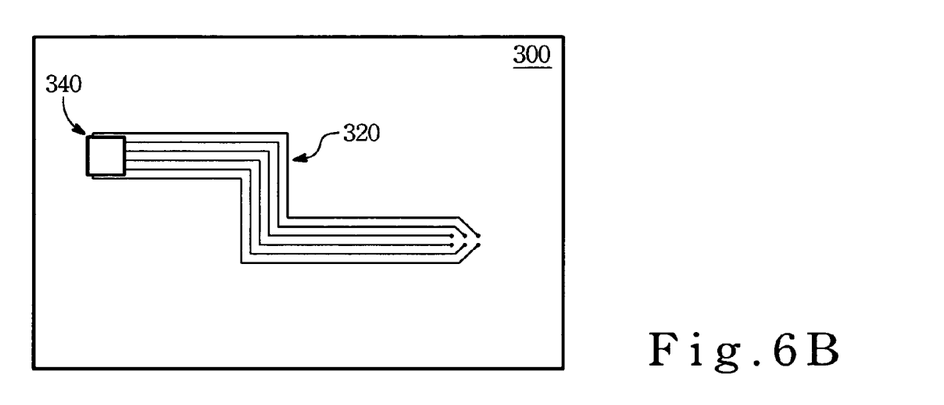
Figure 6C:
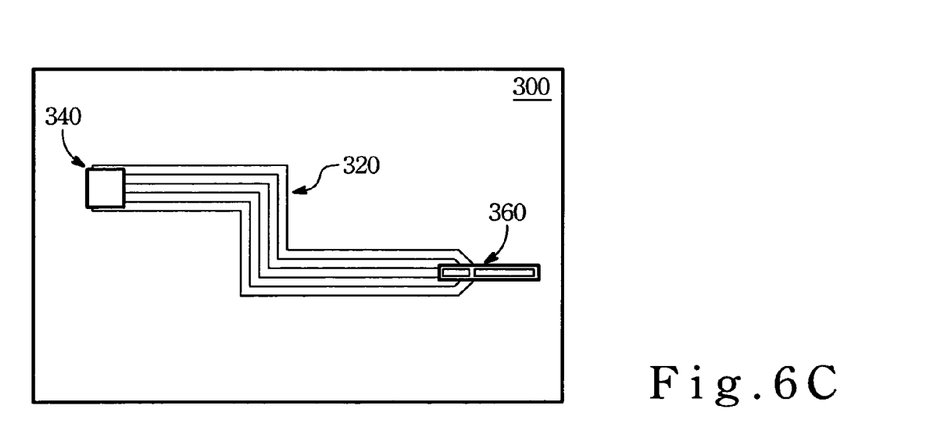

FIGS. 6A to 6C depict a fabrication method for transferring a PCI Express connector with a preset lane width for accepting a PCI Express interfaced apparatus with a relative bigger lane width. Firstly, as shown in FIG. 6A, a circuit board 300 with a PCI Express bus 320 having a preset lane width formed thereon is provided. Then, as shown in FIG. 6B, a PCI Express controller 340 with the preset lane width is assembled to a first end of the bus 320a. Afterward, as shown in FIG. 6C, a PCI Express connector 360 with the bigger lane width is assembled to a second end of the bus 320b. It is noted that not all the contacts of the PCI Express connector 360 are connected to the bus 320, and that, among the unconnected contacts, the contacts related to the lane width are opened and the contacts labeled GND in the contact definition table are grounded.

Figure 7:
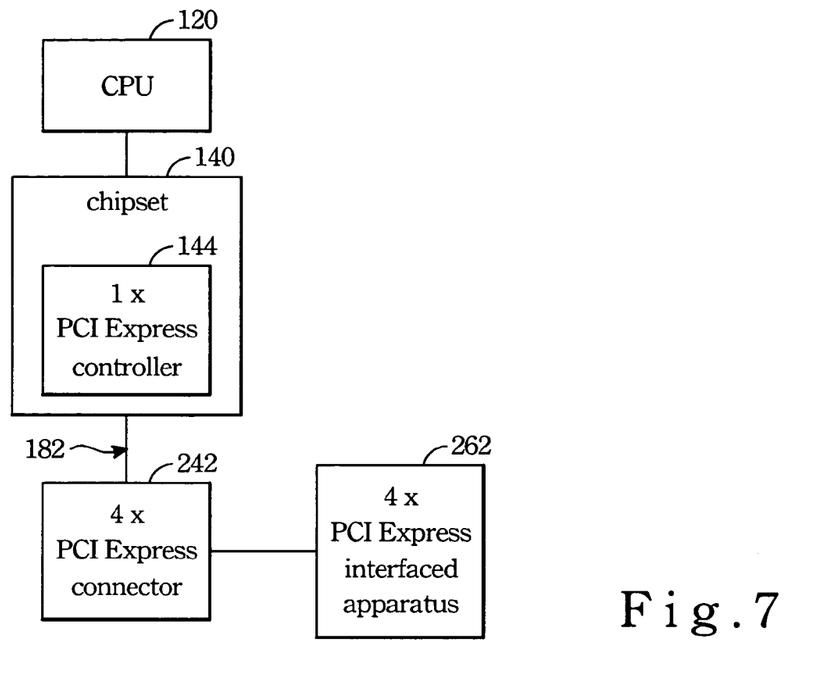
FIG. 7 depicts a schematic view of the first preferred embodiment of the electronic system in accordance with the present invention.

FIG. 7 shows the first preferred embodiment of an electronic system 10 in accordance with the present invention. The electronic system 10 comprises a CPU 120, a chip set 140, a ×4 PCI Express connector 242, and a ×4 PCI Express interfaced apparatus 262. The ×4 PCI Express interfaced apparatus 262, such as a ×4 PCI Express displaying card, is accepted by the ×4 PCI Express connector 242. A ×1 PCI Express controller 144 is provided within the chip set 140 and connected to the ×4PCI Express connector 242 through a ×1 PCI Express bus 182. Not all the contacts of the PCI Express connector 242 are connected to the bus 182. Among the rest unconnected contacts, the lane width-related contacts are opened, and the contacts labeled GND in the contact definition table are grounded.

Figure 8:
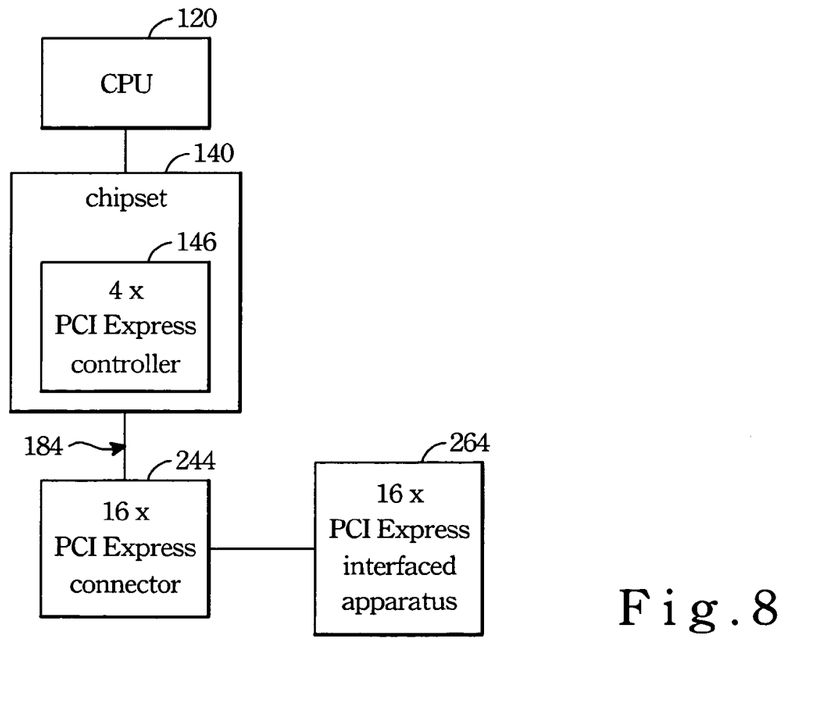
FIG. 8 depicts a schematic view of the second preferred embodiment of the electronic system in accordance with the present invention.

FIG. 8 shows a second embodiment of an electronic system 10 in accordance with the present invention. By contrast to the embodiment shown in FIG. 7, a ×16 PCI Express connector 244 and a ×16 PCI Express interfaced apparatus 264 are used in the present embodiment. The ×16 PCI Express interfaced apparatus 264 is plugged into the ×16 PCI Express connector 244. The chip set 140 is provided with a ×4 PCI Express controller 146, which connects to the ×16 PCI Express connector 264 through a ×4 PCI Express bus 184 directly.

According to the above-mentioned embodiment, it is noted that a 2×, ×4, 6×, 8×, or ×16 PCI Express connector can be used in the electronic system of the present invention to electrically connect a PCI Express controller with a smaller lane width by compared to the PCI Express connector.

Figure 9:
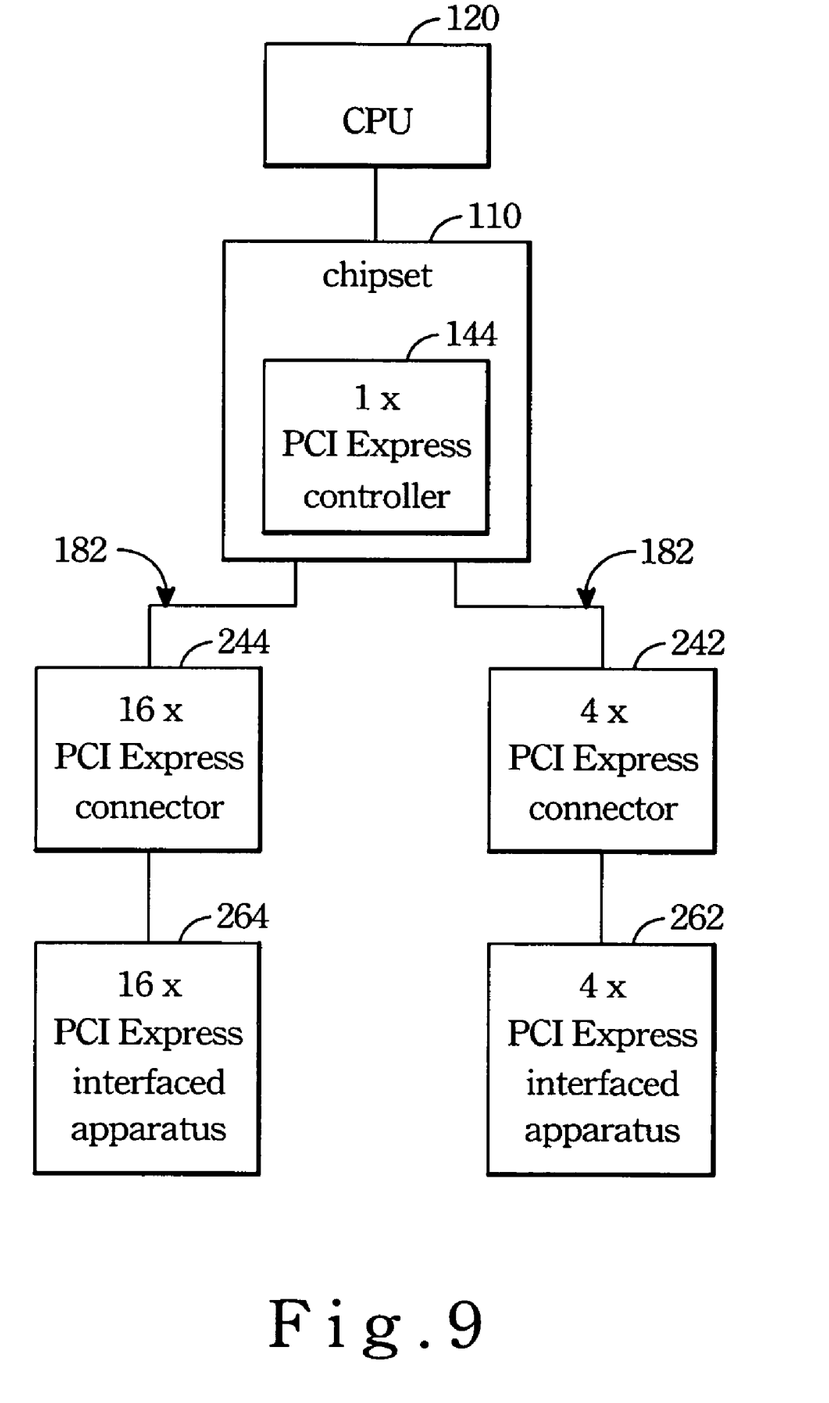
FIG. 9 depicts a schematic view of the third preferred embodiment of the electronic system in accordance with the present invention.

FIG. 9 shows a third embodiment of an electronic system 10 in accordance with the present invention. By contrast to the embodiment of FIG. 7, a ×4 PCI Express connector 242, a ×16 PCI Express connector 244, a ×4 PCI Express interfaced apparatus 262, and a ×16 PCI Express interfaced apparatus 264 are included in the third embodiment. The ×4 PCI Express interfaced apparatus 262 is plugged into the ×4 PCI Express connector 242, and the ×16 PCI Express interfaced apparatus 264 is plugged into the ×16 PCI Express connector 244. The chip set 140 is provided with a 1× PCI Express controller 144, which connects to the ×4 PCI Express connector 242 and to the ×16 PCI Express connector 244 through two respective 1× PCI Express buses 182. Thus, the PCI Express connectors 242 and 244 with various lane widths may be used in the electronic system 10 of the present invention to accept respective PCI Express interfaced apparatuses 262 and 264 with different lane widths.

It is noted that the electronic system in accordance with the present invention allows a PCI Express controller with a preset lane width to accept a PCI Express interfaced apparatus with a bigger lane width. Therefore, available PCI Express interfaced apparatuses can be decided by the chip set having a PCI Express controller. For example, if the chip set supports merely a 1× PCI Express interfaced apparatus, the user may use a PCI Express connector with a relative bigger lane to accept the PCI Express interfaced apparatus with the bigger lane width.

Although an ordinarily NB, such as the Grantsdale of Intel, may not have a ×16 PCI Express interface and an AGP interface to work at the same time, yet, according to the present invention, when a SB such as the SB 965 of SiS is provided to support a PCI Express displaying card with a relative smaller lane width, and when an AGP interfaced supported NB such as the NB 748 or 655FX is used, a main board with such an SB and such an NB can be fulfilled to successfully support both the AGP and the ×16 PCI Express interfaced apparatuses.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A main board, comprising:
   a controller that qualifies for PCI Express Base Specification Revision 1.0a with a preset lane width; and
   a connector that qualifies for PCI Express Base Specification Revision 1.0a with a bigger lane width with respect to the controller, having a plurality of contacts utilized for connecting to an interfaced apparatus that qualifies for PCI Express Base Specification Revision 1.0a with the bigger lane width, wherein part of the contacts are electrically connected to the controller.

2. The main board of claim 1, wherein the contacts electrically connected to the controller forming at least a lane.

3. The main board of claim 1, wherein the contacts of the connector having no connection with the controller comprises at least one grounded contact and the rest contacts thereof are opened.

4. The main board of claim 1, wherein the contacts of the connector having no connection with the PCI Express controller are all opened.

5. The main board of claim 1 further comprising a chip set, wherein the controller is provided in the chip set.

6. The main board of claim 1 further comprising another connector with the preset lane width.

7. An electronic system comprising:
   a controller that qualifies for PCI Express Base Specification Revision 1.0a with a preset lane width;
   a connector that qualifies for PCI Express Base Specification Revision 1.0a with a bigger lane width with respect to the controller, having a plurality of contacts, wherein part of the contacts are electrically connected to the controller; and
   an interfaced apparatus that qualifies for PCI Express Base Specification Revision 1.0a with the bigger lane width, electrically connected to the controller through the connector.

8. The electronic system of claim 7, wherein the contacts electrically connected to the controller forming at least a lane.

9. The electronic system of claim 7, wherein the contacts of the connector having no connection with the controller comprises at least one grounded contact and the rest contacts thereof are opened.

10. The electronic system of claim 7, wherein the contacts of the connector having no connection with the controller are all opened.

11. The electronic system of claim 7 further comprising a chip set, wherein the controller is provided in the chip set.

12. A method of having an interface that qualifies for PCI Express Base Specification Revision 1.0a with a preset lane width to accept a an interfaced apparatus that qualifies for PCI Express Base Specification Revision 1.0a with a relative bigger lane width comprising the steps of:

provide a circuit board with a bus adapting to the preset lane width formed thereon;

assembling a controller that qualifies for PCI Express Base Specification Revision 1.0a with the preset lane width to a first end of the bus; and assembling a connector that qualifies for PCI Express Base Specification Revision 1.0a with the bigger lane width to a second end of the bus utilized for connecting to the interfaced apparatus that qualifies for PCI Express Base Specification Revision 1.0a with the bigger lane width, wherein part of contacts within the connector corresponding to the controller are connected to the bus.

13. The method of claim 12 further comprising a step of having the contacts within the connector without corresponding to the controller remain opened.

14. The method of claim 12 further comprising a step of grounding at least one contact within the connector and having the other contacts without connecting to the bus remain opened.

* * * * *